United States Patent
Hong

(10) Patent No.: US 9,224,434 B2
(45) Date of Patent: Dec. 29, 2015

(54) VOLTAGE GENERATING CIRCUIT

(71) Applicant: TAIWAN SEMICONDUCTOR MANUFACTURING COMPANY, LTD., Hsinchu (TW)

(72) Inventor: Hyun-Sung Hong, Kanata (CA)

(73) Assignee: TAIWAN SEMICONDUCTOR MANUFACTURING COMPANY, LTD. (TW)

(*) Notice: Subject to any disclaimer, the term of this patent is extended or adjusted under 35 U.S.C. 154(b) by 147 days.

(21) Appl. No.: 13/791,129

(22) Filed: Mar. 8, 2013

(65) Prior Publication Data

US 2014/0063981 A1 Mar. 6, 2014

Related U.S. Application Data

(60) Provisional application No. 61/695,136, filed on Aug. 30, 2012.

(51) Int. Cl.
*G11C 5/14* (2006.01)
*G11C 11/4074* (2006.01)
*G11C 11/4094* (2006.01)

(52) U.S. Cl.
CPC ............ *G11C 5/147* (2013.01); *G11C 11/4074* (2013.01); *G11C 11/4094* (2013.01)

(58) Field of Classification Search
USPC ..................... 365/189.09, 203, 205
See application file for complete search history.

(56) References Cited

U.S. PATENT DOCUMENTS

| 6,967,857 | B2* | 11/2005 | Afghahi ..................... 365/49.11 |
| 7,492,645 | B2* | 2/2009 | Kang et al. ............... 365/189.09 |
| 7,579,821 | B2* | 8/2009 | Lee et al. ....................... 323/313 |
| 2009/0285032 | A1* | 11/2009 | Choi ......................... 365/189.05 |
| 2010/0246300 | A1* | 9/2010 | Choi et al. ..................... 365/201 |

* cited by examiner

*Primary Examiner* — Hoai V Ho
*Assistant Examiner* — Minh Dinh
(74) *Attorney, Agent, or Firm* — Hauptman Ham, LLP

(57) ABSTRACT

A circuit includes a first transistor of a first type, a second transistor of a second type, a sense amplifier, a first data line, and a second data line. The second type is different from the first type. The first data line is coupled with a first terminal of the sense amplifier. The second data line is coupled with a second terminal of the sense amplifier. A first terminal of the first transistor is configured to receive a supply voltage. A second terminal of the first transistor, a third terminal of the first transistor, a second terminal of the second transistor, a third terminal of the second transistor are coupled together and are configured to carry a voltage. A first terminal of the second transistor is configured to receive a reference supply voltage. The first and second data lines are configured to receive a voltage value of the voltage.

20 Claims, 11 Drawing Sheets

| | OUT1 | OUT2 | ON_SW1 | ON_SW2 | ON_SW3 | PROCESS CORNER | RELATIONSHIP BETWEEN VREF2, CVREF1, CVREF2 |
|---|---|---|---|---|---|---|---|
| | 930 | 940 | 950 | 960 | 970 | 980 | 990 |
| 905 | 0 | 0 | 1 | 0 | 0 | SF | VREF2 < CVREF1<br>VREF2 < CVREF2 |
| 915 | 0 | 1 | 0 | 1 | 0 | TT | VREF2 < CVREF1<br>VREF2 > CVREF2 |
| 925 | 1 | 1 | 0 | 0 | 1 | FS | VREF2 > CVREF1<br>VREF2 > CVREF2 |

US 9,224,434 B2

VOLTAGE GENERATING CIRCUIT

FIELD

The present disclosure is related to a voltage generating circuit.

BACKGROUND

For brevity, a semiconductor manufacturing process is called a process. Due to uncontrollable manufacturing variations, a process can result in typical transistors, fast transistors, or slow transistors. Compared with a typical transistor, a fast transistor has a higher driving capability and provides a larger current. In contrast, a slow transistor has a lower driving capability and provides a smaller current than a typical transistor. A fast transistor is also called a strong transistor while a slow transistor is also called a weak transistor.

An N-type metal-oxide semiconductor transistor is called an NMOS transistor, and a P-type MOS transistor is called a PMOS transistor. A process that results in a typical NMOS and a typical PMOS transistor is called a typical typical (TT) process or a TT process corner. A process that results in a slow NMOS transistor and a fast PMOS transistor is called a slow fast (SF) process corner. A process that results in a fast NMOS transistor and a slow PMOS transistor is called a fast slow (FS) process corner. Transistors behave differently in different process corners.

In a dynamic random access memory (DRAM) circuit, a pair of bit lines serves as both data input and output for the DRAM cell. A voltage, such as a voltage VBL, is used to pre-charge the bit lines. Pre-charge refers to charging the bit lines before a write or a read operation. Further, voltage VBL is generated based on a reference voltage, such as a voltage VREF. In various situations, a value of voltage VBL is the same as that of voltage VREF, and is a fixed value for different process corners.

In an existing approach, a value of voltage VREF and of voltage VBL is a percentage of a supply voltage VDD, such as 50% of supply voltage VDD. In another approach, a value of voltage VREF and of voltage VBL is generated based on a supply voltage VDD and has a constant value, such as 0.5 V, for example. In both situations, because of manufacturing process variations, the fixed value of voltage VBL in different process corners degrades performance of a sense amplifier used in conjunction with voltage VBL. Further, there is no mechanism to adjust voltage VREF and voltage VBL to compensate for the manufacturing process variations.

BRIEF DESCRIPTION OF THE DRAWINGS

The details of one or more embodiments of the disclosure are set forth in the accompanying drawings and the description below. Other features and advantages will be apparent from the description, drawings, and claims.

Like reference symbols in the various drawings indicate like elements.

DETAILED DESCRIPTION

Figure 1:
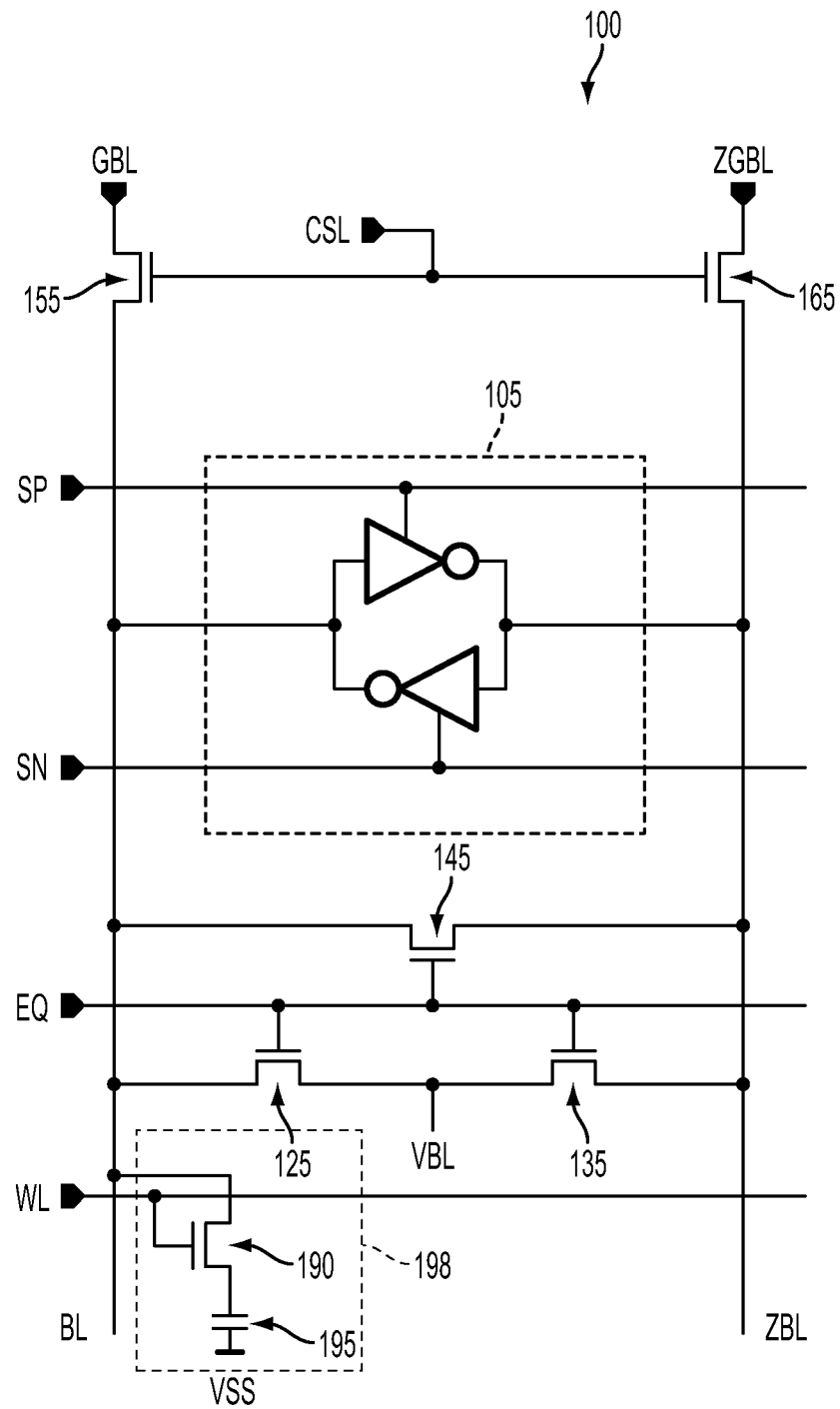
FIG. 1 is a diagram of a dynamic random access memory (DRAM), in accordance with some embodiments.

Embodiments, or examples, illustrated in the drawings are disclosed below using specific language. It will nevertheless be understood that the embodiments and examples are not intended to be limiting. Any alterations and modifications in the disclosed embodiments, and any further applications of the principles disclosed in this document are contemplated as would normally occur to one of ordinary skill in the pertinent art.

Some embodiments have one or a combination of the following features and/or advantages. A voltage VBL is used to pre-charge bit lines in a dynamic random access memory (DRAM). A reference voltage VREF used to generate voltage VBL varies in response to process variations without an external control signal. Voltage VBL also varies in response to the process variations without an external control signal. A sense amplifier used in conjunction with voltage VBL performs better compared with the same amplifier used in conjunction with a corresponding voltage VBL generated by another method in some existing approaches.

Memory Circuit

FIG. 1 is a diagram of a memory circuit 100, in accordance with some embodiments. Memory circuit 100 is a dynamic random access memory (DRAM). Other types of memory are within the scope of various embodiments.

A column select signal CSL and transistors 155 and 165 enable data transfer between a pair of local bit lines BL and ZBL and a pair of global bit lines GBL and ZGBL, respectively.

A signal EQ and transistors 125, 135, and 145 are used to pre-charge and equalize bit lines BL and ZBL. For example, when signal EQ is applied with a high logical value, transistors 125, 135, and 145 are turned on, enabling bit lines BL and ZBL to be at the same voltage level of a voltage VBL at drains of transistors 125 and 135. Stated differently, bit lines BL and ZBL are pre-charged and equalized to a value of voltage VBL.

Figure 3:
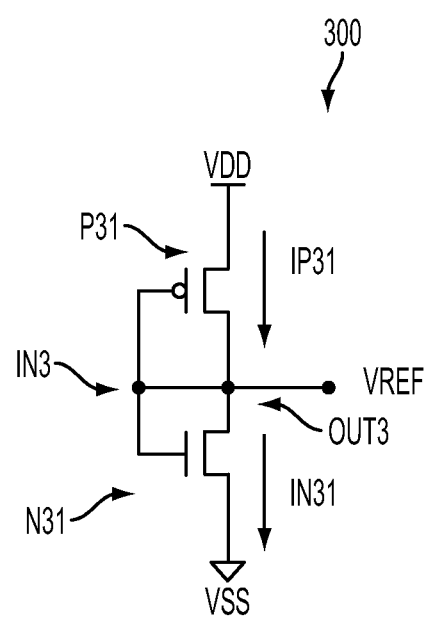
FIG. 3 is a diagram of a circuit generating voltage VREF in FIG. 2, in accordance with some embodiments.

A bit cell 198 includes a pass gate transistor 190 and a memory cell 195. Pas gate transistor 190 allows access between a local sense amplifier 105 and memory cell 195 through the pair of bit lines BL and ZBL. In some embodiments, bit lines BL and ZBL are connected to an equal number of bit cells 198, but only one bit cell 198 connected to bit line BL is shown for illustration. In some embodiments, memory cell 195 is a capacitor storing electrical charges. When memory cell 195 is electrically connected to a bit line, such as bit BL as shown in FIG. 1, a voltage difference between bit line BL and bit line ZBL starts to develop. Further, bit line BL is pulled one way or another depending on the electrical charges that indicate a logical value stored in memory cell 195. For example, if memory cell 195 stores a low logical value, bit line BL is pulled towards a reference voltage VSS, which, in some embodiments, is ground. Conversely, if memory cell 195 stores a high logical value, bit line BL is pulled towards a supply voltage VDD as shown in FIG. 3. A voltage difference between bit line BL and bit line ZBL is called a bit line split.

Bit lines BL and ZBL serve as both data input and output for sense amplifier 105. In some embodiments, in a write operation, applying a logical value to a first bit line and the opposite logical value to the other bit line enables writing the logical value at the first bit line to memory cell 195. In a read operation, sensing the bit line split of bit lines BL and ZBL reveals the data stored in memory cell 195.

A word line WL is used to turn on or off memory pass gate transistor 190 to allow access to memory cell 195 through transistor 190. In FIG. 1, bit cell 198 is electrically coupled with bit line BL for illustration. Depending on implementations in a memory array, some bit cells 198 are connected to bit line BL while some other bit cells 198 are connected to bit line ZBL. When word line WL at the gate of transistor 190 is applied with a low logical value, transistor 190 is turned off. The corresponding memory cell 195 is therefore electrically disconnected from bit line BL and from sense amplifier 105. When word line WL is applied with a high logical value, however, transistor 190 is turned on. The corresponding memory cell 195 is electrically connected to bit line BL.

Signals SP and SN are used to turn on or off sense amplifier 105. In some embodiments, when signals SP and SN are at a same level, amplifier 105 is turned off. But when signals SP and SN are at different levels, such as when signal SP is at supply voltage VDD and signal SN is at supply reference voltage VSS, sense amplifier 105 is on.

Sense amplifier 105 is used to sense or read the data stored in memory cell 195. When the bit line split of bit lines BL and ZBL is sufficiently developed, sense amplifier 105 is turned on to sense or amplify the bit line split and generate a full swing signal on bit lines BL and ZBL that represent the data read from memory cell 195. Sense amplifier 105 also restores the data to memory cell 195, and sends the data to the corresponding global bit lines GBL and ZGBL. Details of sense amplifier 105 are explained with reference to FIG. 4.

In some embodiments, voltage VBL is generated in a way to improve sensing performance of sense amplifier 105, as explained below. As a result, various embodiments of the present disclosures are advantageous over other existing approaches.

Voltage VBL Generating Circuit

Figure 2:
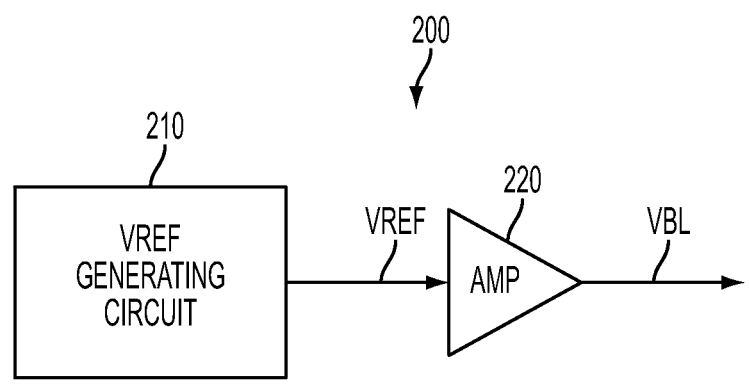
FIG. 2 is a diagram of a circuit generating voltage VBL in FIG. 1, in accordance with some embodiments.

FIG. 2 is a diagram of a circuit 200, in accordance with some embodiments. Circuit 200 is configured to generate voltage VBL in memory circuit 100.

A voltage VREF generating circuit 210 is configured to generate a reference voltage VREF. Details of circuit 210 are explained with reference to FIGS. 3 and 6 below.

In some embodiments, a voltage value of reference voltage VREF fluctuates depending on a load of circuit 200 that receives reference voltage VREF. An operational amplifier 220, labeled as AMP 220, provides stability to voltage VREF by generating voltage VBL. In some embodiments, voltage VBL has a same voltage value as voltage VREF, but does not fluctuate in different situations having different loads. For example, voltage VBL does not fluctuate when circuit 200 is used to provide voltage VBL for memory circuit 100 in FIG. 1.

Voltage VREF generating circuit 210 and AMP 220 are used for illustration. Other circuits generating voltage VBL are within the scope of various embodiments. Because a voltage value of voltage VREF is the same as that of voltage VBL, a reference to voltage VREF also refers to voltage VBL. In embodiments that voltage VREF does not fluctuate, AMP 220 is not used. In such a condition, voltage VREF is voltage VBL.

AMP 220 shown outside of voltage VREF generating circuit 210 is for illustration. In some embodiments, AMP 220 is part of voltage generating circuit 210. Various embodiments of the present disclosure are not limited to a particular location of AMP 220.

Votlag VREF Generating Circuit

FIG. 3 is a diagram of a circuit 300, in accordance with some embodiments. Circuit 300 is an embodiment of voltage VREF generating circuit 210 in FIG. 2. Circuit 300 includes a PMOS transistor P31 coupled in series with an NMOS transistor N31.

A source of PMOS transistor P31 receives supply voltage VDD. A gate of PMOS transistor P31 is coupled with a gate of NMOS transistor N31, a drain of PMOS transistor P31, a drain of NMOS transistor N31, and is configured to provide reference voltage VREF. A source of NMOS transistor N31 receives supply reference voltage VSS. Effectively, PMOS transistor P31 and NMOS transistor N31 are configured as an inverter with an input IN3 coupled with an output OUT3.

A current IP31 flows through PMOS transistor P31 and a current IN31 flows through NMOS transistor N31. Individually, a value of current IP31 depends on a driving capability or a strength of PMOS transistor P31. Similarly, a value of current IN31 depends on a driving capability or a strength of NMOS transistor N31. Regardless of the strength of PMOS transistor P31 and of NMOS transistor N31, at an equilibrium or operational condition, current IP31 equals current IN31 due to the configuration of circuit 300.

In some embodiments, a voltage value of voltage VREF is selected based on a size of PMOS transistor P31 and a size of NMOS transistor N31, and is explained below with reference to FIGS. 4 and 5. Voltage VREF is self-adjustable. For example, voltage VREF changes without any control signal external to circuit 300. Voltage VREF, however, changes depending on the process corner used to manufacture circuit 300. In other words, a value of voltage VREF is different at different process corners of memory circuit 100, of circuit 200, of circuit 300, etc.

In some embodiments, in a TT process corner, NMOS transistor N31 is as strong as PMOS transistor P31. As a result, initially, when circuit 300 and when PMOS transistor P31 and NMOS transistor N31 are turned on, current IN31 equals current IP31. In an SF process corner, NMOS transistor N31 is weaker than PMOS transistor P31. As a result, when circuit 300 is turned on, current IN31 is less than current IP31. By continued operation of circuit 300, so that current IN31 equals to current IP31, voltage VREF increases to cause NMOS transistor N31 to be stronger until NMOS transistor N31 is as strong as PMOS transistor P31 and current IP31 equals current IN31. In other words, voltage VREF is self-increased.

In an FS process corner, NMOS transistor N31 is stronger than PMOS transistor P31. As a result, when circuit 300 is turned on, current IN31 is higher than current IP31. By continued operation of circuit 300, so that current IP31 equals current IN31, voltage VREF decreases to cause PMOS transistor P31 to be stronger until PMOS transistor P31 is as strong as NMOS transistor N31 and current IN31 equals current IP31. In other words, voltage VREF is self-decreased.

Effectively, by operation of circuit 300, a voltage value of voltage VREF in a TT process corner is higher than a voltage value of voltage VREF in an FS corner, but is lower than a value of voltage VREF in an SF corner.

In some embodiments, a value of voltage VREF is pre-determined. A size of PMOS transistor P31 and/or of NMOS transistor N31 is adjusted to provide the pre-determined voltage VREF, considering process variations, including, for example, whether circuit 300 is a result of a TT, SF, or FS process corner.

Factors Affecting Voltage VREF

Figure 4:
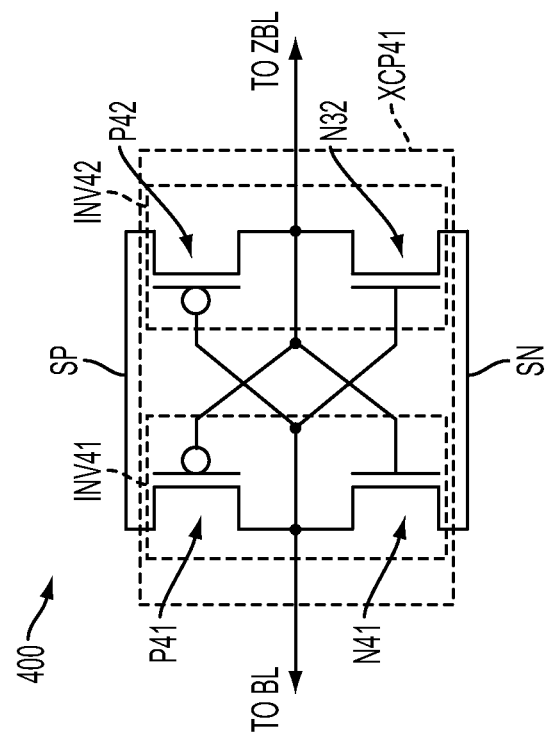
FIG. 4 is a diagram of the sense amplifier circuit in FIG. 1, in accordance with some embodiments.

FIG. 4 is a diagram of a sense amplifier (SA) 400, in accordance with some embodiments. SA 400 is an embodiment of sense amplifier 105 in FIG. 1.

SA 400 includes a PMOS transistor P41, a PMOS transistor P42, an NMOS transistor N41, and an NMOS transistor N42.

PMOS transistor P41 and NMOS transistor N41 form an inverter INV41. PMOS transistor P42 and NMOS transistor N42 form an inverter INV2. Inverters INV41 and INV2 form a cross-coupled pair XCP41. In other words, PMOS transistor P41, PMOS transistor P42, NMOS transistor N41, and NMOS transistor N42 form cross-coupled pair XCP41.

A drain of PMOS transistor P41, a drain of NMOS transistor N41, a gate of PMOS transistor P42, a gate of NMOS transistor N42, and bit line BL in FIG. 1 are coupled together. A drain of PMOS transistor P42, a drain of NMOS transistor N42, a gate of PMOS transistor P41, a gate of NMOS transistor N41, and bit line ZBL in FIG. 1 are coupled together. Effectively, with respect to inverter INV42, bit line BL serves as an input while bit line ZBL serves as an output. Similarly with respect to inverter INV41, bit line ZBL serves as an input while bit line BL serves as an output.

Supply voltage SP is provided to sources of PMOS transistors P41 and P42. Supply voltage SN is provided to sources of NMOS transistors N41 and N42.

Figure 5:
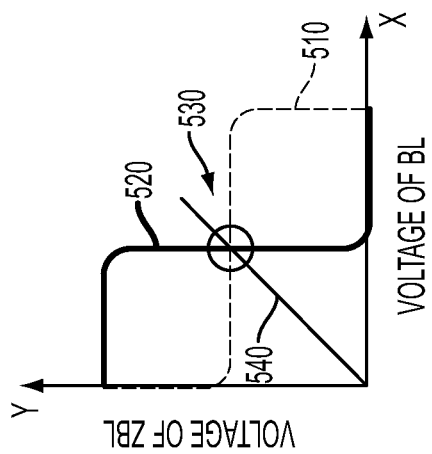
FIG. 5 is a graph of a voltage transfer curve of bit line BL and of bit line ZBL in FIG. 4, in accordance with some embodiments.

FIG. 5 is a graph of voltage transfer curves (VTCs) of inverter INV41 and inverter INV42. A VTC curve is also called a butterfly curve.

The X-axis represents a voltage range of bit line BL while the Y-axis represents a voltage range of bit line ZBL. Effectively, the X-axis represents a voltage input for inverter INV42, the Y-axis represents a voltage output for inverter INV42. A curve 520 represents a VTC of bit line ZBL. In contrast, the Y-axis represents a voltage input for inverter INV41, the X-axis represents a voltage output for inverter INV41. A curve 510 represents a VTC of bit line BL. Different ways to obtain VTC 510 and VTC 520 based on characteristics of inverter INV41 and inverter INV42 are within the scope of various embodiments.

A point 530 is a cross point of VTC 510 and VTC 520. A line 540 passes through the origin of the X and Y coordinates and point 530. In some embodiments, a size of PMOS transistor P31 and/or a size of NMOS N31 in FIG. 3 is adjusted such that a value of voltage VREF is on line 540 and is as close to point 530 as possible. For illustration, a value of voltage VREF and a value of voltage VBL are on point 530. As a result, a charge sharing loss when SA 400 is turned on to sense the bit line split of bit lines BL and ZBL is insignificant or eliminated. Consequently, performance of SA 400 is improved.

Point 530 varies with process variations. For example, a voltage value of point 530 in a TT process corner is higher than a voltage value of point 530 in an SF process corner, but is lower than a voltage value of point 530 in an FS process corner. In some embodiments, when point 530 varies in response to variations of process corners of SA 400, a voltage value of voltage VREF varies accordingly to follow point 530. This is because voltage VREF is generated by circuit 300 that has a circuit structure similar to a circuit structure of each of inverters INV41 and INV42. For example, circuit 300 is formed by a PMOS transistor such as PMOS transistor P31 coupled in series with an NMOS transistor such as NMOS transistor N31. Similarly, inverter INV41 is formed by a PMOS transistor such PMOS transistor P41 coupled in series with an NMOS transistor such as NMOS transistor N41, and inverter INV42 is formed by a PMOS transistor such as PMOS transistor P42 coupled in series with an NMOS transistor such as NMOS transistor N42.

Because a voltage value of voltage VREF follows point 530 in different process corners, SA 400 performs in a similar manner regardless of the different process corners. As a result, various embodiments of the disclosure are advantageous over other approaches. For example, in some existing approaches, when point 530 changes in response a process variation, voltage VBL continues to remain at a same voltage. Consequently, performance of a sense amplifier corresponding to SA 400 in the existing approaches is degraded.

Voltage VREF Generating Circuit, Further Embodiment

Figure 6:
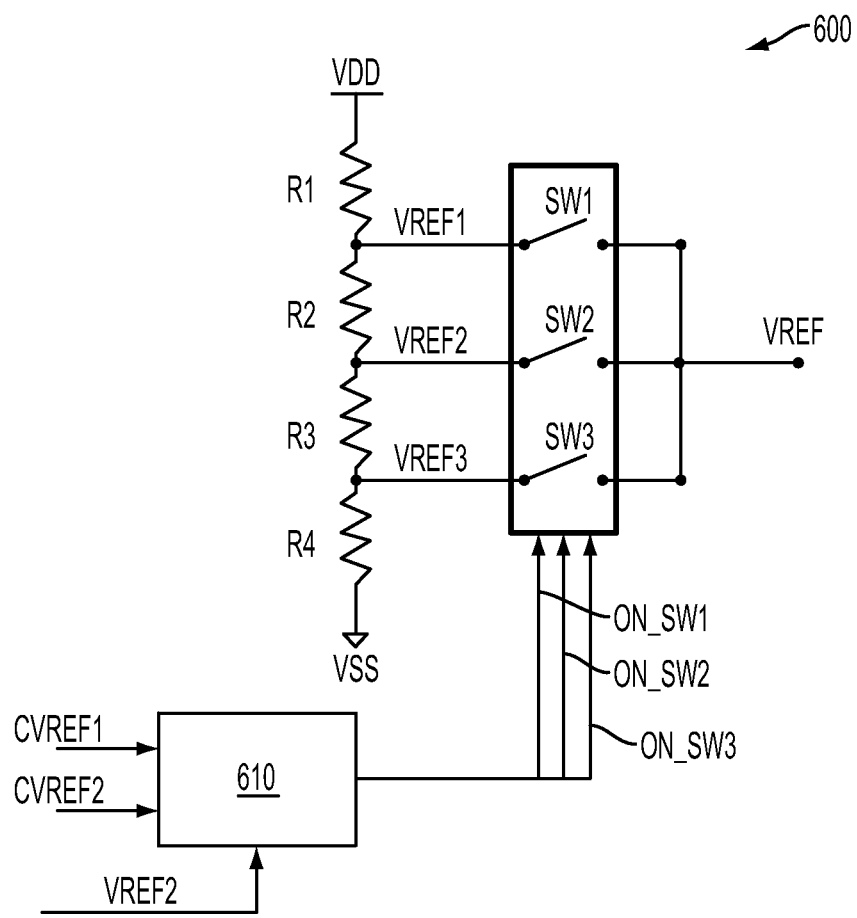
FIG. 6 is diagram of a circuit generating voltage VREF in FIG. 2, in accordance with some further embodiments.

FIG. 6 is a diagram of a circuit 600, in accordance with some embodiments. Circuit 600 is another embodiment of voltage VREF generating circuit 210 in FIG. 2.

A switching control circuit 610 is configured to receive reference voltages CVREF1, CVREF2, and VREF2 to generate signals ON_SW1, ON_SW2, and ON_SW3 to close and open switches SW1, SW2, and SW3, respectively. Details of how voltages CVREF1 and CVREF2 are generated are illustrated with reference to FIGS. 7A and 7B, respectively. Details of circuit 610 are explained with reference to FIGS. 8 and 9.

In some embodiments, when signals ON_SW1, ON_SW2, and ON_SW3 are each logically high, switches SW1, SW2, and SW3 are each closed, respectively. But when signals ON_SW1, ON_SW2, and ON_SW3 are each logically low, switches SW1, SW2, and SW3 are each open, respectively.

Resistors R1, R2, R3, and R4, together with supply voltage VDD, function as a voltage divider and provide voltages VREF1, VREF2, and VREF3. In some embodiments, a value of voltage VREF2 is selected based on point 530 similar to a value of voltage VREF being selected based on point 530 as illustrated above with reference to FIG. 5 in the TT process corner. A value of voltage VREF1 is then arbitrarily selected to be less than a value of voltage VREF2 considering various factors, including, for example, a change of point 530 from the TT corner to the corner FS. In some embodiments, the value of voltage VREF1 is on line 540 and is as close to point 530 in the FS corner as possible. A value of voltage VREF3 is also arbitrarily selected to be higher than a value of voltage VREF2 considering various factors, including, for example, a change of point 530 from the TT process corner to the SF process corner. In some embodiments, the value of voltage VREF3 is on line 540 and as close to point 530 in the SF corner as possible.

Switches SW1, SW2, SW3 are configured to transfer a corresponding value of voltages VREF1, VREF2, and VREF3 as a value of voltage VREF. For example, when switch SW1 is closed while switches SW2 and SW3 are open, a value of voltage VREF1 is transferred to voltage VREF. Similarly, when switch SW2 is closed while switches SW1 and SW3 are open, a value of voltage VREF2 is transferred to voltage VREF, and when switch SW3 is closed while switches SW1 and SW2 are open, a value of voltage VREF3 is transferred to voltage VREF. In some embodiments, each of switches SW1, SW2, and SW3 is closed one at a time.

In FIG. 6, three switches SW1, SW2, and SW3 are used for illustration. A different number of switches is within the scope of various embodiments. Three switches in FIG. 6 use two reference voltages CVREF1 and CVREF2 to generate three control signals ON_SW1, ON_SW2, and ON_SW3. When a different number of control signals and a different number of reference voltages corresponding to voltages CVREF1 and CVREF2 change, a different number of switches is used in circuit 600. For example, if four reference voltages are used as inputs to circuit 610, five control signals are generated to control five switches. In some embodiments, the number of switches equals the number of control signals plus one.

As the number of switches increases, a resolution of voltage VREF and of voltage VBL is finer, and performance of SA 105 is better. As a result, the number of memory cell unit 198 coupled to bit line BL or bit line ZBL is increased. Additionally, sensing speed of SA 105 also increases.

Circuits Generating Votlages CVREF1 and CVREF2

Figures 7A, 7B:
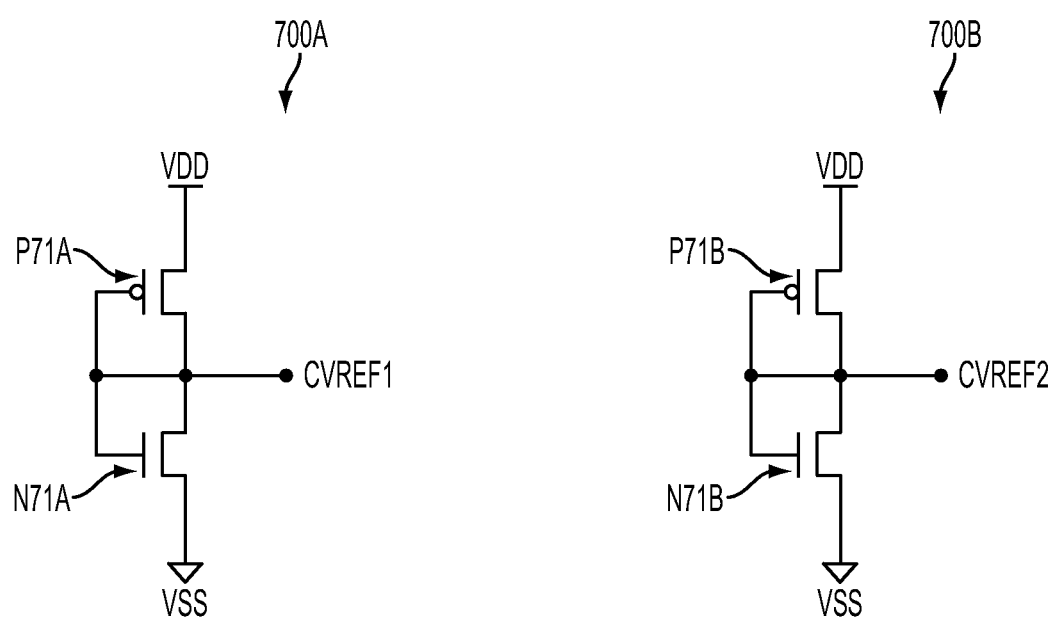
FIG. 7A is a diagram of a circuit generating voltage CVREF1 in FIG. 6, in accordance with some embodiments.
FIG. 7B is a diagram of a circuit generating voltage CVREF2 in FIG. 6, in accordance with some embodiments.

FIG. 7A is diagram of a circuit 700A, in accordance with some embodiments. Circuit 700A is configured to generate reference voltage CVREF1 in FIG. 6.

Circuit 700A includes a PMOS transistor P71A and an NMOS transistor N71A. Compared with circuit 300, PMOS transistor P71A and NMOS transistor N71A are configured in a similar manner as PMOS transistor P31 and NMOS N31, respectively. Effectively, PMOS transistor P71A and NMOS transistor N71A are configured as an inverter having an input coupled with an output that carries a voltage CVREF1.

In some embodiments, voltage VREF2 in FIG. 6, a size of transistor P71A and/or a size of transistor N71A in FIG. 7A are selected such that the following conditions are met:
in an SF process corner, CVREF1>VREF2
in a TT process corner, CVREF1>VREF2
in an FS process corner, CVREF1<VREF2

In some embodiments, a size of PMOS transistor P71A is about four times of a size of NMOS transistor N71A. As a result, PMOS transistor P71A is stronger than N71A. Other sizes of PMOS transistor P71A and NMOS transistor N71A are within the scope of various embodiments.

FIG. 7B is diagram of a circuit 700B, in accordance with some embodiments. Circuit 700B is configured to generate reference voltage CVREF2 in FIG. 6. In some embodiments, a value of reference voltage reference voltage CVREF1 in FIG. 6 is higher than a value of reference voltage CVREF2.

Circuit 700B includes a PMOS transistor P71B and an NMOS transistor N71B. Compared with circuit 700A, PMOS transistor P71B and NMOS transistor N71B are configured in a similar manner as PMOS transistor P7P1A and NMOS transistor N71A, respectively. In some embodiments, a size of NMOS transistor N71B is about 4 times a size of PMOS transistor N71B. Other sizes of PMOS transistor P71B and N71B such that NMOS transistor N71B is stronger than PMOS transistor P71B are within the scope of various embodiments. As a result, NMOS transistor N71B is stronger than PMOS transistor P71B, and the following conditions are met:
in an SF process corner, CVREF2>VREF2
in a TT process corner, CVREF2<VREF2
in an FS process corner, CVREF2<VREF2

Switching Control Circuit

Figures 8, 9:
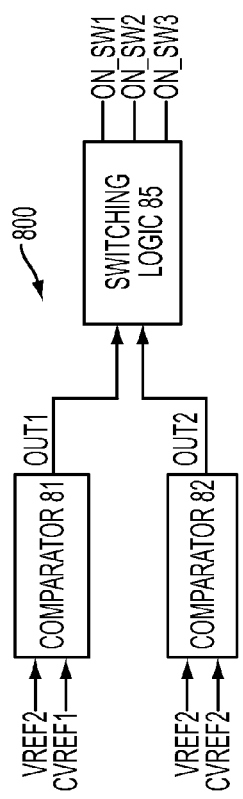
FIG. 8 is a diagram of the switching control circuit of the circuit in FIG. 6, in accordance with some embodiments.
FIG. 9 is table of operations of the circuit in FIG. 8, in accordance with some embodiments.

FIG. 8 is a diagram of a circuit 800, in accordance with some embodiments. Circuit 800 is an embodiment of circuit 610 in FIG. 6.

A comparator 81 compares voltage VREF2 and voltage CVREF1 to generate an output OUT1. In some embodiments, when voltage VREF2 is greater than or equal to voltage CVREF1, output OUT1 is logically high. But when voltage VREF2 is less than voltage CVREF1, output OUT1 is logically low.

A comparator 82 compares voltage VREF2 and voltage CVREF2 to generate an output OUT2. In some embodiments, when voltage VREF2 is greater than or equal to voltage CVREF2, output OUT2 is logically high. But when voltage VREF2 is less than voltage CVREF2, output OUT2 is logically low.

A switching logic circuit 85, labeled as switching logic 85, based on outputs OUT1 and OUT2, generates switching control signals ON_SW1, ON_SW2, and ON_SW3 in FIG. 6. A relationship between output OUT1, output OUT2 and signals ON_SW1, ON_SW2, and ON_SW3 are shown in columns 930-970 and rows 905-925 of table 900 in FIG. 9.

Table of Signal Relationships

FIG. 9 is a table 900 showing relationships of various signals in different process corners, in accordance with some embodiments.

With reference to a row 905, both outputs OUT1 and OUT2 are logically low as shown in respective columns 930 and 940. Signals ON_SW1, ON_SW2, and ON_SW3 are logically high, low, and low, respectively. In such a condition, the process corner of circuit 800 is SF, as indicated in column 980. Further, voltage VREF2 is less than both voltages CVREF1 and CVREF2, as shown in column 990.

With reference to a row 910, output OUT1 is logically and output OUT2 is logically high as shown in respective columns 930 and 940. Signals ON_SW1, ON_SW2, and ON_SW3 are logically low, high, and low, respectively. In such a condition, the process corner of circuit 800 is TT, as shown in column 980. Further, voltage VREF2 is less than voltage CVREF1, but is greater than voltage CVREF2, as shown in column 990.

With reference to a row 915, both outputs OUT1 and OUT2 are logically high as shown in respective columns 930 and 940. Signals ON_SW1, ON_SW2, and ON_SW3 are logically low, low, and high, respectively. In such a condition, the process corner of circuit 800 is FS, as shown in column 980. Further, voltage VREF2 is greater than both voltages CVREF1 and CVREF2, as shown in column 990.

In some embodiments, voltage VREF2 is substantially fixed at a value regardless of process variations because voltage VREF2 is generated by supply voltage VDD and resistors R1, R2, R3, and R4, which do not change or change insignificantly with respect to process variations. Voltage CVREF1 and voltage CVREF2 vary with process variations, however. As a result, switches ON_SW1, ON_SW2, and ON_SW3 are turned on in response to the process variations to provide corresponding values for voltage VREF. Consequently, at each process corner, such as TT, SF, and FS, there is a corresponding value of voltage VREF2, VREF1, or VREF3, as voltage VREF. In other words, voltage VREF is adjusted in accordance with process variations.

Graph of Voltage Relationships

Figure 10:
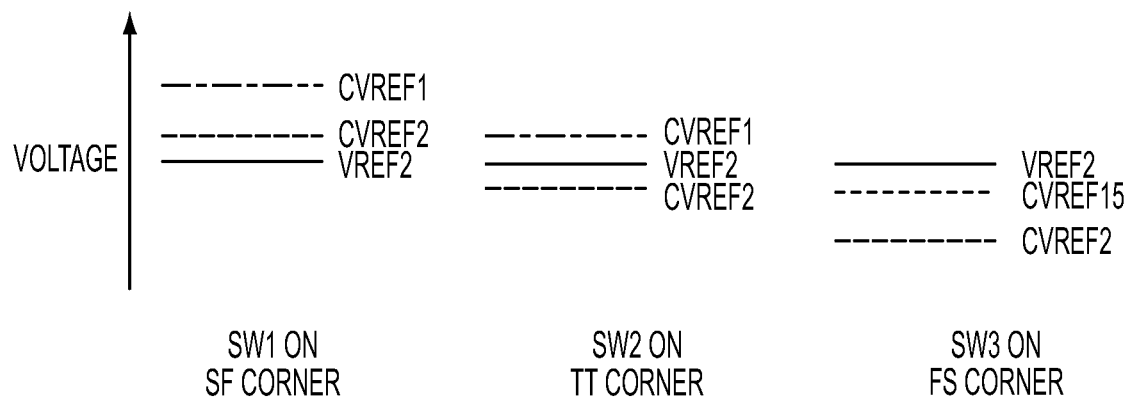
FIG. 10 is a graph of voltages CVREF1, CVREF2, and VREF2 of the circuit in FIG. 6, in accordance with some embodiments.

FIG. 10 is a graph 1000 of relationships between voltages VREF2, CVREF1, and CVREF2, in accordance with some embodiments. FIG. 10 is another way to illustrate relationships between voltages VREF2, CVREF1, and CVREF2 in different process corners. In this illustration, a value of voltage VREF2 has been selected as explained above with reference to FIG. 6, and values of voltages CVREF1 and CVREF2 are each selected and depicted relative to the selected value of voltage VREF2. Further, the selected value of voltage VREF2 remains the same in the SF corner, the TT corner, and the FS corner.

When circuits 100, 200, and 600 are in a TT corner, switch SW2 is closed or "ON." A value of voltage CVREF1 is selected to be higher than the selected value of voltage VREF2, but a value of voltage CVREF2 is selected to be lower than the selected value of voltage VREF2. When circuits 100, 200, and 600 are in an SF corner, switch SW1 is closed or "ON." Both values of voltage CVREF1 and voltage CVREF2 are selected to be higher than the selected value of voltage VREF2. When circuit 100 is in an FS corner, switch SW3 is closed or "ON," and both values of voltage CVREF1 and voltage CVREF2 are selected to be lower than the selected value of voltage VREF2.

In some embodiments, the actual values of each of voltage CVREF1 and CVREF2 are each arbitrarily selected considering various factors including, for example, the resolution of corresponding comparator 81 and comparator 82, changes of voltage CVREF1 and/or voltage CVREF2 in different process corners.

Illustrative Waveforms

Figure 11:
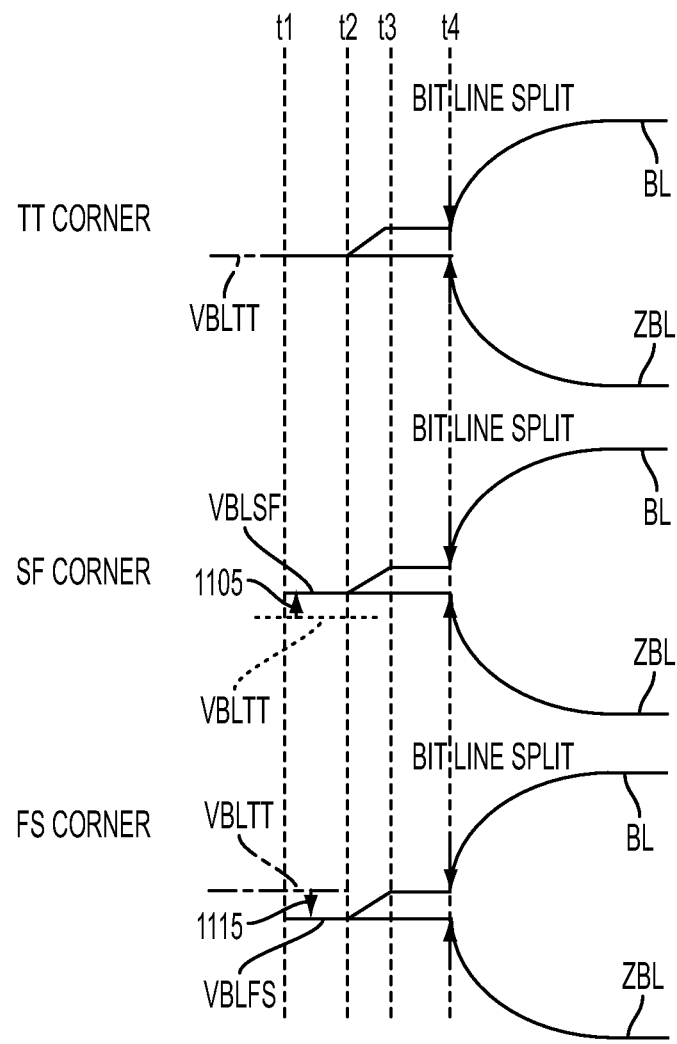
FIG. 11 is a graph of waveforms of bit lines BL and ZBL in different process corners, in accordance with some embodiments.

FIG. 11 is a graph 1100 of waveforms of bit lines BL and ZBL, in accordance with some embodiments. In this illustration, memory 195 in FIG. 1 is accessed in a read operation in the TT, SF, and FS process corners, and the data stored in memory 195 is reflected on bit lines BL and ZBL. Further, either circuit 300 in FIG. 3 or circuit 600 in FIG. 6 is used to provide voltage VBL as voltages VBLTT, VBLSF, and VBLFS when memory circuit 100 is manufactured by a TT, an SF, and an FS process corner, respectively.

Between a time t1 and a time t2, in the TT, SF, and FS process corners, both bit lines BL and ZBL are pre-charged to voltage values VBLTT, VBLSF, and VBLFS, respectively.

In the SF corner, voltage VBLSF is higher than voltage VBLTT. As a result, the voltage levels of bit lines BL and ZBL are raised as illustrated by the up arrow 1105. In contrast, in the FS corner, voltage VBLFS is lower than voltage VBLTT. As a result, the voltage levels of bit lines BL and ZBL are lowered as illustrated by the down arrow 1115.

At time t2, word line WL in FIG. 1 is activated to turn on transistor 190. As a result, memory cell 195 is electrically coupled with bit line BL, and a bit line split of bit lines BL and ZBL develops between time t2 and time t3.

At time t3, the bit line split is sufficient for SA 105 to sense the voltage difference of bit line BL and bit line ZBL. Between time t3 and time t4, the bit line split remains at a same value until time t4 when SA 105 is activated.

At time t4, SA 105 is activated. As a result, the bit line split further develops. In the example of FIG. 11, bit line BL rises to a high logical value while bit line ZBL is lowered to a low logical value.

In some embodiments, a value of voltage VBLTT is about half of a value of supply voltage VDD, such as 0.5 V. A value of voltage VBLSF is about 0.6 V while a value of voltage VBLFS is about 0.4 V.

In the illustration of FIG. 11, bit line BL and bit line ZBL, after time t4, develop to a high and a low logical value, respectively. Bit lines BL and ZBL developing to a low and a high logical value, respectively, are similar and are within the scope of various embodiments. Further, bit line BL being coupled with memory unit 198 is for illustration. Bit line ZBL coupled with memory unit 198 is within the scope of various embodiments.

Various embodiments of the disclosure are advantageous over another existing approach. For example, in various embodiments of the present disclosure, in the TT, SF, and FS process corners, at time t4 when SA 105 is activated, all three bit line splits are about the same value, even though voltage values VBLTT, VBLSF, and VBLFS of voltage VBL are different in different process corners. Effectively, sensing performance of SA 105 is about the same in the TT, SF, and FS process corners. In contrast, in the existing approach, a voltage value corresponding to voltage values VBLTT, VBLSF, and VBLFS is the same for the TT, SF, and FS process corners. At about time t4 when the corresponding sense amplifier in the existing approach is activated, each of the bit line split in the SF and the FS process corners is affected by a glitch. For example, in the existing approach, in the SF corner, the glitch causes a voltage of bit line ZBL to be raised, while a voltage of bit line BL stays the same. As a result, the bit line split is reduced in the SF corner in the existing approach. For another example, in the existing approach, in the FS corner, the glitch causes a voltage on bit line BL to be lowered while a voltage of bit line ZBL stays the same. As a result, the bit line split is reduced in the FS corner in the existing approach. Consequently, in the existing approach, in the SF and FS process corners, performance of the corresponding sense amplifier is degraded.

Exemplary Method

Figure 12:
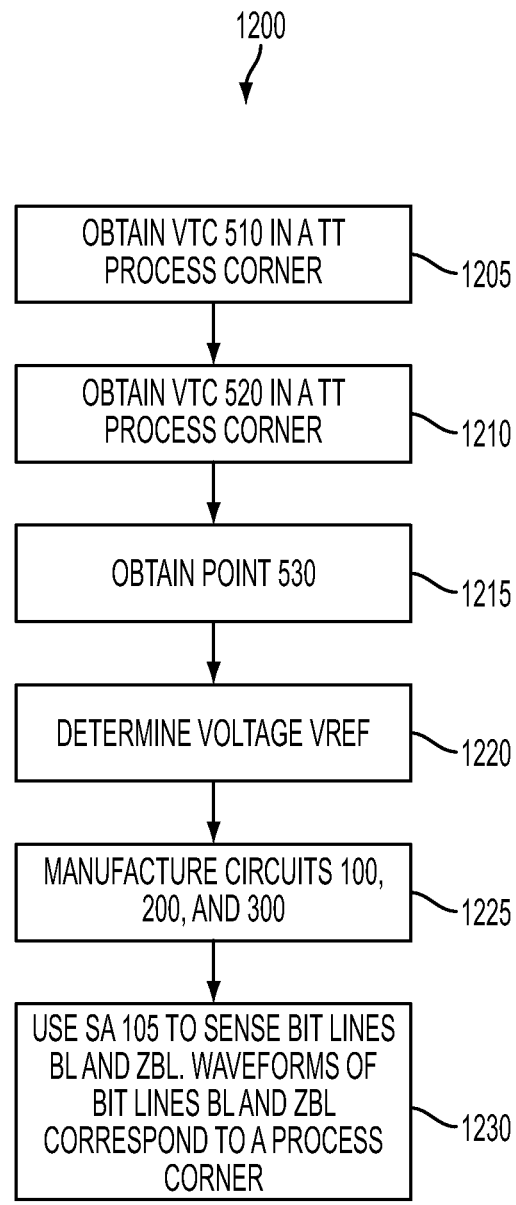
FIG. 12 is a flowchart of a method used to illustrate how the waveforms of bit lines BL and ZBL result in different process corners, in accordance with some embodiments.

FIG. 12 is a flowchart of a method 1200, in accordance with some embodiments. Method 1200 is used to illustrate how the waveforms of bit line BL and bit line ZBL are generated in different process corners as shown in FIG. 11. In this illustration, circuit 300 in FIG. 3 is used to provide voltage VREF to circuit 200 in FIG. 2.

In operation 1205, voltage transfer curve (VTC) 510 is obtained in a TT process corner as explained above with reference to FIG. 5. VTC 510 and characteristics of the TT process corner are obtained through simulations. The TT process corner is used for illustration. Other process corners used in operation 1205 are within the scope of various embodiments.

In operation 1210, VTC 520 is obtained in the TT process corner as explained above with reference to FIG. 5. VTC 520 and characteristics of the TT process corner are obtained through simulations. The TT process corner is used for illustration. Other process corners used in operation 1205 are within the scope of various embodiments.

In operation 1215, point 530 is obtained by determining a cross point of VTC 510 and VTC 520.

In operation 1220, voltage VREF is determined based on point 530 as explained above with reference to FIG. 5. For illustration, voltage VREF is on line 540 and is as close to point 530 as possible.

In operation 1225, circuits 100, 200, and 300 are manufactured. Depending on the manufacturing process of circuits 100, 200, and 300, a TT, an SF, or an FS process corner results.

In operation 1230, SA 105 is used to sense the bit line split of bit lines BL and ZBL. The waveforms of bit lines BL and ZBL correspond to a process corner resulted in operation 1225, and are shown in the TT, SF, or FS corner in FIG. 11. For example, in some embodiments, in the TT corner a value of voltage VREF and of voltage VBL are about half a value of supply voltage VDD, such as 0.5 V. In other words, voltage VBLTT is about 0.5 V. In the SF corner, however, a value of voltage VREF and of voltage VBL is higher than half of a value of supply voltage VDD, such as 0.6 V. In other words, a value of voltage VBLSF is about 0.6 V. In contrast, in the FS corner, a value of voltage VREF and of voltage VBL is lower than half of a value of supply voltage VDD, such as 0.4 V. In other words, a value of voltage VBLFS is about 0.4 V.

Figure 13:
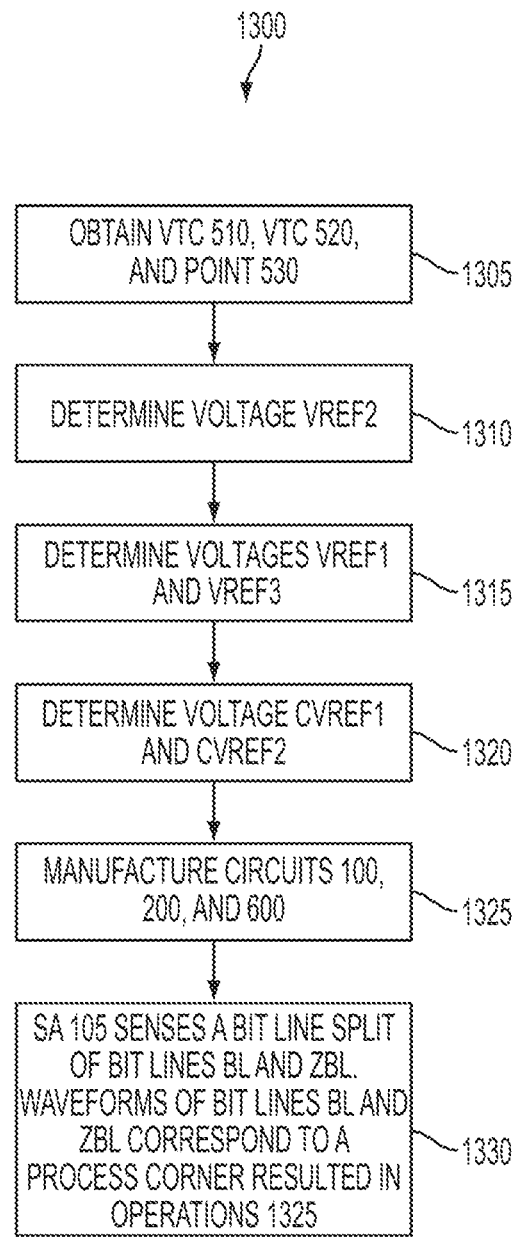
FIG. 13 is a flowchart of another method used to illustrate how the waveforms of bit lines BL and ZBL result in different process corners, in accordance with some further embodiments.

FIG. 13 is a flowchart of a method 1300, in accordance with some embodiments. Method 1300 is used to illustrate how the waveforms of bit line BL and bit line ZBL are generated in different process corners shown in FIG. 11. In this illustration, circuit 600 in FIG. 6 is used to provide voltage VREF to circuit 200 in FIG. 2.

In operation 1305, VTC 510, VTC 520, and point 530 are obtained in the TT process corner with reference to FIG. 5. Operation 1305 corresponds to operations 1205, 1210, and 1215 of method 1200 in FIG. 12. VTC 510, VTC 520, and characteristics of the TT process corner are obtained through simulations. The TT process corner is used for illustration. Other process corners used in operation 1305 are within the scope of various embodiments.

In operation 1310, a value of voltage VREF2 in FIG. 6 is determined based on point 530 as illustrated with reference to FIG. 5. For illustration, voltage VREF2 is on line 540 and is as close to point 530 as possible.

In operation 1315, a value of each of voltage VREF1 and voltage VREF3 is determined based on the value voltage VREF2. In some embodiments, the value of voltage VREF2 is higher than the value of voltage VREF1, and is lower than the value of voltage VREF3.

In operation 1320, a value of each of voltage CVREF1 and voltage CVREF2 is determined as explained above with reference to circuits 700A and 700B in FIGS. 7A and 7B, respectively.

In operation 1325, circuits 100, 200, and 600 are manufactured. Depending on the manufacturing process of circuits 100, 200, and 600, a TT, an SF, or an FS process corner results.

In operation 1330, SA 105 is used to sense the bit line split of bit line BL and bit line ZBL as illustrated in FIG. 11. The corresponding waveforms of bit lines BL and ZBL correspond to a process corner resulted in operation 1325, and are shown in the TT, SF, or FS corner in FIG. 11. For example, in some embodiments, in the TT corner a value of voltage VREF and of voltage VBL is about half a value of supply voltage VDD, such as 0.5 V. In other words, a value of voltage VBLTT is about 0.5 V. In the SF corner, however, a value of voltage VREF and of voltage VBL is higher than half of a value of supply voltage VDD, such as 0.6 V. In other words, a value of voltage VBLSF is about 0.6 V. In contrast, in the FS corner, a value of voltage VREF and of voltage VBL is lower than half of a value of supply voltage VDD, such as 0.4 V. In other words, a value of voltage VBLFS is about 0.4 V.

In some embodiments, a circuit comprises a first transistor of a first type, a second transistor of a second type, a sense amplifier, a first data line, and a second data line. The second type is different from the first type. The first data line is coupled with a first terminal of the sense amplifier. The second data line is coupled with a second terminal of the sense amplifier. A first terminal of the first transistor is configured to receive a supply voltage. A second terminal of the first transistor, a third terminal of the first transistor, a second terminal of the second transistor, and a third terminal of the second transistor are coupled together and are configured to carry a voltage. A first terminal of the second transistor is configured to receive a reference supply voltage. The first data line and the second data line are configured to receive a voltage value of the voltage.

In some embodiments, a circuit comprises a sub circuit, a switching circuit, and a switching control circuit. The sub circuit is configured to generate a first voltage value, a second voltage value, and a third voltage value. A switching circuit is configured to selectively transfer the first voltage value, the second voltage value, or the third voltage value to an output voltage based on control signals. A switching control circuit is configured to receive a first reference voltage value, a second reference voltage value, and the second voltage value. The switching control circuit is also configured to generate the control signals of the switching circuit based on a first relationship between the first reference voltage value and the second voltage value and a second relationship between the second reference voltage value and the second voltage value.

In some embodiments, based on a voltage that has different voltage values in different process corners, a pair of data lines is pre-charged in a first time period. A bit line split is caused between the data lines to develop in a second time period. In both the first time period and the second time period, a first voltage value of the different voltage values in a first process corner is self-adjustable to a second voltage value in a second process corner.

A number of embodiments have been described. It will nevertheless be understood that various modifications may be made without departing from the spirit and scope of the disclosure. For example, various transistors are shown as a particular dopant type, such as an N-type or a P-type Metal Oxide Semiconductor (NMOS or PMOS). Embodiments of the disclosure are not limited to a particular dopant type. Selecting different dopant types for a particular transistor is within the scope of various embodiments. A low or a high logical value of various signals used in the above description is also for illustration. Various embodiments are not limited to a particular logical value when a signal is activated and/or deactivated. Selecting different logical values is within the scope of various embodiments. In various embodiments, a transistor functions as a switch. A switching circuit used in place of a transistor is within the scope of various embodiments. In various embodiments, a source of a transistor can be configured as a drain, and a drain can be configured as a source. Various figures show resistors using discrete resistors for illustration. Equivalent circuitry may be used. For example, a resistive device, circuitry or network that is a combination of resistors, resistive devices, circuitry, etc., can be used in place of the resistor.

The above illustrations include exemplary steps, but the steps are not necessarily performed in the order shown. Steps may be added, replaced, changed order, and/or eliminated as appropriate, in accordance with the spirit and scope of disclosed embodiments.

What is claimed is:

1. A circuit comprising:
a sub circuit configured to generate a first voltage value, a second voltage value, and a third voltage value;
a switching circuit configured to selectively transfer the first voltage value, the second voltage value, or the third voltage value to an output voltage based on control signals; and
a switching control circuit configured to receive a first reference voltage value, a second reference voltage value, and the second voltage value, and, generate the control signals of the switching circuit based on
a first relationship between the first reference voltage value and the second voltage value, and
a second relationship between the second reference voltage value and the second voltage value.

2. The circuit of claim 1, wherein
the switching circuit includes a first switch, a second switch, and a third switch; and
the switching control circuit is configured to generate a first control signal, a second control signal, and a third control signal of the control signals;
the first switch is configured to be controlled by the first control signal;
the second switch is configured to be controlled by the second control signal; and
the third switch is configured to be controlled by the third control signal.

3. The circuit of claim 1, further comprising:
a first voltage generating circuit configured to provide the first reference voltage value having a first self-adjustable voltage value; and
a second voltage generating circuit configured to provide the second reference voltage value having a second self-adjustable voltage value.

4. The circuit of claim 1, further comprising a sense amplifier, a first data line and a second data line, wherein
the first data line is coupled with a first terminal of the sense amplifier;
the second data line is coupled with a second terminal of the sense amplifier; and
the first data line and the second data line are configured to selectively receive the first voltage value, the second voltage value, or the third voltage value.

5. The circuit of claim 4, wherein
the sense amplifier includes a first inverter and a second inverter that form a cross latch;
the first inverter has a first voltage transfer curve;
the second inverter has a second voltage transfer curve;
the first voltage transfer curve and the second voltage transfer curve include a cross point; and
the second voltage value is selected based on the cross point.

6. The circuit of claim 5, wherein
the cross point and an origin of a first coordinate and a second coordinate of the first and second voltage transfer curves form a line; and
the second voltage value is on the line.

7. The circuit of claim 1, further comprising
a first voltage generating circuit configured to provide the first reference voltage value having first different voltage values in different process corners; and
a second voltage generating circuit configured to provide the second reference voltage value having second different voltage values in different process corners.

8. The circuit of claim 1, further comprising:
a first voltage generating circuit that includes a first inverter having an input coupled with an output and configured to provide the first reference voltage value; and
a second voltage generating circuit that includes a second inverter having an input coupled with an output and configured to provide the second reference voltage value different from the first reference voltage value.

9. The circuit of claim 1, further comprising:
a first voltage generating circuit that includes a first inverter formed by a first transistor of a first type coupled in series with a second transistor of a second type different from the first type, wherein the first transistor has a driving capability stronger than a driving capability of the second transistor; and
a second voltage generating circuit that includes a second inverter formed by a third transistor of the first type coupled in series with a fourth transistor of the second type, wherein the fourth transistor has a driving capability stronger than a driving capability of the third transistor.

10. The circuit of claim 1, further comprising:
a first voltage generating circuit that includes a first transistor of a first type and a second transistor of a second type different from the first type,
wherein
a first terminal of the first transistor is configured to receive a supply voltage;
a second terminal of the first transistor, a third terminal of the first transistor, a second terminal of the second transistor, and a third terminal of the second transistor are coupled together and are configured to provide the first reference voltage value; and
a first terminal of the second transistor is configured to receive a reference supply voltage;
a second voltage generating circuit that includes a third transistor of the first type and a fourth transistor of the second type,
wherein
a first terminal of the third transistor is configured to receive the supply voltage;
a second terminal of the third transistor, a third terminal of the third transistor, a second terminal of the fourth transistor, a third terminal of the fourth transistor are coupled together and are configured to provide the second reference voltage value; and
a first terminal of the fourth transistor is configured to receive the reference supply voltage.

11. The circuit of claim 1, wherein
the switching control circuit includes a first comparator, a second comparator, and a switching logic;
the first comparator is configured to provide a first comparator output based on the first reference voltage value and the second voltage value;
the second comparator is configured to provide a second comparator output based on the second reference voltage value and the second voltage value; and
the switching logic is configured to generate the control signals of the switching circuit based on the first comparator output and the second comparator output.

12. The circuit of claim 1, wherein
in a first process corner, the second voltage value is lower than both the first reference voltage value and the second reference voltage value;
in a second process corner, the second voltage value is lower than the first reference voltage value, and is higher than second reference voltage value; and in a third process corner, the second voltage value is higher than both the first reference voltage value and the second reference voltage value.

13. The circuit of claim 12, wherein
in the first process corner, a driving capability of an N-type transistor in the circuit is lower than a driving capability of a P-type transistor in the circuit;
in the second process corner, the driving capability of the N-type transistor is about the same as the driving capability of the P-type transistor; and
in the third process corner, the driving capability of the N-type transistor is higher than the driving capability of the P-type transistor.

14. The circuit of claim 1, wherein
the sub circuit includes a voltage divider configured to generate the first voltage value, the second voltage value, and the third voltage value.

15. A circuit comprising:
a sub circuit configured to generate a plurality of voltage signals having different voltage values;
a switching circuit configured to selectively output one of the plurality of voltage signals as an output voltage of the switching circuit based on a set of control signals; and
a switching control circuit configured to generate the set of control signals based on a first comparison result and a second comparison result, the first comparison result corresponding to comparing a voltage level of a first reference voltage and a voltage level of a predetermined one of the plurality of voltage signals, and the second comparison result corresponding to comparing a voltage level of a second reference voltage and the voltage level of the predetermined one of the plurality of voltage signals.

16. The circuit of claim 15, further comprising:
a first voltage generating circuit configured to generate the first reference voltage; and
a second voltage generating circuit configured to generate the second reference voltage,
wherein the first voltage generating circuit, the second voltage generating circuit, and the sub circuit are configured such that
the voltage level of the predetermined one of the plurality of voltage signals is between the voltage levels of the first reference voltage and the second reference voltage when the circuit is in a typical typical (TT) process corner;
the voltage level of the predetermined one of the plurality of voltage signals is less than the voltage levels of the first reference voltage and the second reference voltage when the circuit is in a fast slow (FS) process corner; and
the voltage level of the predetermined one of the plurality of voltage signals is greater than the voltage levels of the first reference voltage and the second reference voltage when the circuit is in a slow fast (SF) process corner.

17. The circuit of claim 15, further comprising:
a first voltage generating circuit configured to generate the first reference voltage, the first voltage generating circuit comprising:
a first P-type transistor having a gate and a drain; and
a first N-type transistor having a gate and a drain,
the gate and the drain of the first P-type transistor and the gate and the drain of the first N-type transistor electrically coupled together and configured to carry the first reference voltage; and
a driving capability of the first P-type transistor being greater than a driving capability of the first N-type transistor; and
a second voltage generating circuit configured to generate the second reference voltage, the second voltage generating circuit comprising:
a second P-type transistor having a gate and a drain; and
a second N-type transistor having a gate and a drain,
the gate and the drain of the second P-type transistor and the gate and the drain of the second N-type transistor electrically coupled together and configured to carry the second reference voltage; and
a driving capability of the second N-type transistor being greater than a driving capability of the second P-type transistor.

18. A circuit comprising:
a voltage divider configured to output a first voltage having a first voltage level, a second voltage having a second voltage level, and a third voltage having a third voltage level, the first voltage level being greater than the second voltage level, and the second voltage level being greater than the third voltage level;
a first voltage generating circuit configured to generate a first reference voltage, the first reference voltage having a first reference voltage level, the first reference voltage level being greater than the second voltage level when the circuit is in a typical typical (TT) process corner, and less than the second voltage level when the circuit is in a fast slow (FS) process corner; and
a second voltage generating circuit configured to generate a second reference voltage, the second reference voltage having a second reference voltage level, the second reference voltage level being less than the second voltage level when the circuit is in the TT process corner, and greater than the second voltage level when the circuit is in a slow fast (SF) process corner;
a switching control circuit configured to generate a set of control signals based on comparing the second voltage level, the first reference voltage level, and the second reference voltage level; and
a switching circuit configured to selectively output one of the first voltage, the second voltage, or the third voltage as an output voltage of the switching circuit based on the set of control signals.

19. The circuit of claim 18, wherein
the first voltage generating circuit comprises:
a first P-type transistor having a gate and a drain; and
a first N-type transistor having a gate and a drain,
the gate and the drain of the first P-type transistor and the gate and the drain of the first N-type transistor electrically coupled together and configured to carry the first reference voltage; and
a driving capability of the first P-type transistor being greater than a driving capability of the first N-type transistor; and
the second voltage generating circuit comprises:
a second P-type transistor having a gate and a drain; and
a second N-type transistor having a gate and a drain,
the gate and the drain of the second P-type transistor and the gate and the drain of the second N-type transistor electrically coupled together and configured to carry the second reference voltage; and
a driving capability of the second N-type transistor being greater than a driving capability of the second P-type transistor.

20. The circuit of claim 18, wherein
the switching control circuit comprises a first comparator, a second comparator, and a switching logic;
the first comparator is configured to provide a first comparator output based on the second voltage level and the first reference voltage level;
the second comparator is configured to provide a second comparator output based on the second voltage level and the second reference voltage level; and
the switching logic is configured to generate the set of control signals based on the first comparator output and the second comparator output.

* * * * *